(12) United States Patent
Chang et al.

(10) Patent No.: US 10,476,513 B1
(45) Date of Patent: Nov. 12, 2019

(54) SAR ADC WITH HIGH LINEARITY

(71) Applicants: NCKU Research and Development Foundation, Tainan (TW); Himax Technologies Limited, Tainan (TW)

(72) Inventors: Soon-Jyh Chang, Tainan (TW); Li-Jen Chang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 16/195,629

(22) Filed: Nov. 19, 2018

(51) Int. Cl.
*H03M 1/06* (2006.01)
*H03M 1/00* (2006.01)
*H03M 1/60* (2006.01)
*H03M 1/12* (2006.01)

(52) U.S. Cl.
CPC ............ *H03M 1/06* (2013.01); *H03M 1/002* (2013.01); *H03M 1/12* (2013.01); *H03M 1/60* (2013.01)

(58) Field of Classification Search
CPC .......... H03M 1/06; H03M 1/002; H03M 1/12; H03M 1/60
USPC .......................................... 341/118, 120, 155
See application file for complete search history.

(56) References Cited

U.S. PATENT DOCUMENTS

| | | | |
|---|---|---|---|
| 10,250,277 B1* | 4/2019 | Sim | H03M 3/464 |
| 10,263,629 B2* | 4/2019 | Wen | H03M 1/1009 |
| 10,291,252 B1* | 5/2019 | Farid | H03M 1/466 |
| 10,305,501 B2* | 5/2019 | Fan | H03M 1/004 |

OTHER PUBLICATIONS

Hlung-Yen Tai et al, A 0.85fJ/Conversion-Step 10b 200kS/s Subranging SAR ADC i 40 nm CMOS, 2014 IEEE International Solid-State Circuits Conference, Session 11, Data Converter Techniques, 11.2.

* cited by examiner

*Primary Examiner* — Brian K Young
(74) *Attorney, Agent, or Firm* — Donald E. Stout; Stout, Uxa & Buyan, LLP (57) ABSTRACT

A successive approximation register (SAR) analog-to-digital converter (ADC) with high linearity for generating an n-bit converted output includes a first capacitor digital-to-analog (DAC) and a second capacitor DAC. One of the first capacitor DAC and the second capacitor DAC that has greater output signal is defined as a higher-voltage capacitor DAC, and the other as an un-switching capacitor DAC. In an m-th conversion phase, an (m−1)-th capacitor of the un-switching capacitor DAC is switched according to a comparison between output signals of the higher-voltage capacitor DAC and the un-switching capacitor DAC.

20 Claims, 7 Drawing Sheets

Code = 0

SAR ADC WITH HIGH LINEARITY

BACKGROUND OF THE INVENTION

1. Field of the Invention

The present invention generally relates to an analog-to-digital converter (ADC), and more particularly to a successive approximation register (SAR) ADC.

2. Description of Related Art

A successive approximation register (SAR) analog-to-digital converter (ADC) is a type of ADC that coverts an analog signal to a digital equivalent of the signal. The SAR ADC performs conversion by comparison and searching through all possible quantization levels to obtain a digital output. The SAR ADC requires less silicon area and the associated cost than other ADC architectures. Although the SAR ADC consumes less power than other ADC architectures, its power consumption is still too high to be adapted to some electronic devices that have limited power source. Moreover, the conventional SAR ADC suffers non-linearity and capacitor mismatch.

For the foregoing reason, a need has arisen to propose a novel SAR ADC with linearity, power and capacitor mismatch improvement.

SUMMARY OF THE INVENTION

In view of the foregoing, it is an object of the embodiment of the present invention to provide a successive approximation register (SAR) analog-to-digital converter (ADC) with high linearity, low power consumption and improved capacitor mismatch.

According to one embodiment, a successive approximation register (SAR) analog-to-digital converter (ADC) is disclosed. A SAR ADC is provided for generating an n-bit converted output, the SAR ADC including a first capacitor digital-to-analog (DAC) and a second capacitor DAC. In sampling phase, all capacitors of the first capacitor DAC and the second capacitor DAC are switched to a common voltage. In a first conversion phase, a first most-significant-bit (MSB) of the converted output is determined according to a comparison between output signals of the first capacitor DAC and the second capacitor DAC. One of the first capacitor DAC and the second capacitor DAC that has greater output signal is defined as a higher-voltage capacitor DAC, and the other of the first capacitor DAC and the second capacitor DAC as an un-switching capacitor DAC. All capacitors of the higher-voltage capacitor DAC are switched to ground, the common voltage being greater than the ground but less than a power supply. In an m-th conversion phase (1<m<n), an m-th MSB of the converted output is determined according to a comparison between output signals of the first capacitor DAC and the second capacitor DAC. An (m−1)-th capacitor of the un-switching capacitor DAC is switched according to a comparison between output signals of the higher-voltage capacitor DAC and the un-switching capacitor DAC. In an n-th conversion phase, a least significant bit (LSB) of the converted output is determined according to a comparison between output signals of the first capacitor DAC and the second capacitor DAC.

BRIEF DESCRIPTION OF THE DRAWINGS

FIG. 4A to FIG. 9B show exemplary switching of the first capacitor DAC and the second capacitor DAC at different phases of performing the SAR ADC.

DETAILED DESCRIPTION OF THE INVENTION

Figure 1:
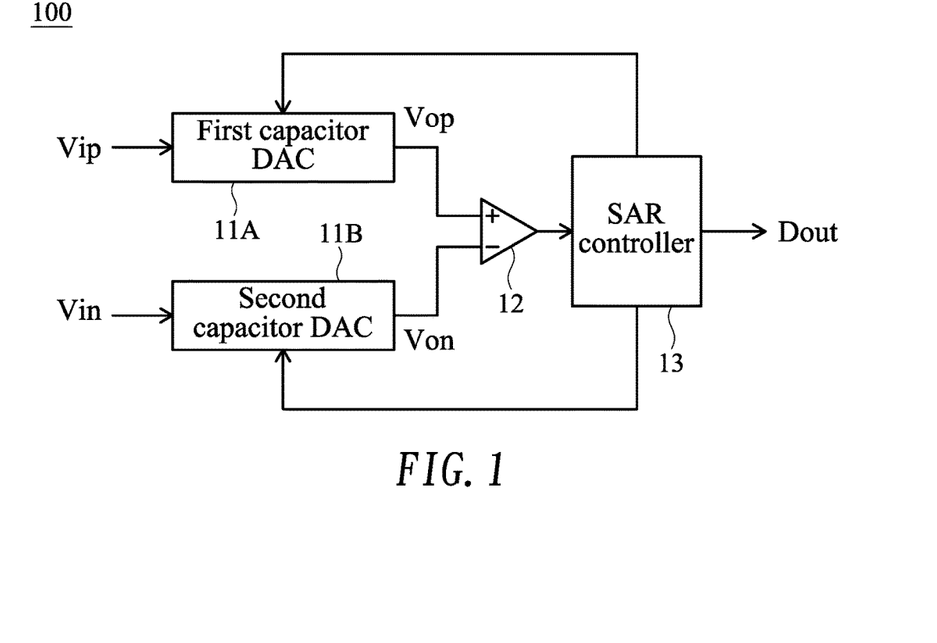
FIG. 1 shows a block diagram illustrating a successive approximation register (SAR) analog-to-digital converter (ADC) with high linearity and low power consumption according to one embodiment of the present invention.

FIG. 1 shows a block diagram illustrating a successive approximation register (SAR) analog-to-digital converter (ADC) 100 with high linearity and low power consumption according to one embodiment of the present invention.

In the embodiment, the SAR ADC 100 may include a first capacitor digital-to-analog (DAC) 11A and a second capacitor DAC 11B that are coupled to receive a first input signal Vip (e.g., a positive input signal) and a second input signal Vin (e.g., a negative input signal) respectively, and are configured to generate a first output signal Vop (e.g., a positive output signal) and a 15 second output signal Von (e.g., a negative output signal) respectively.

Figure 2A:
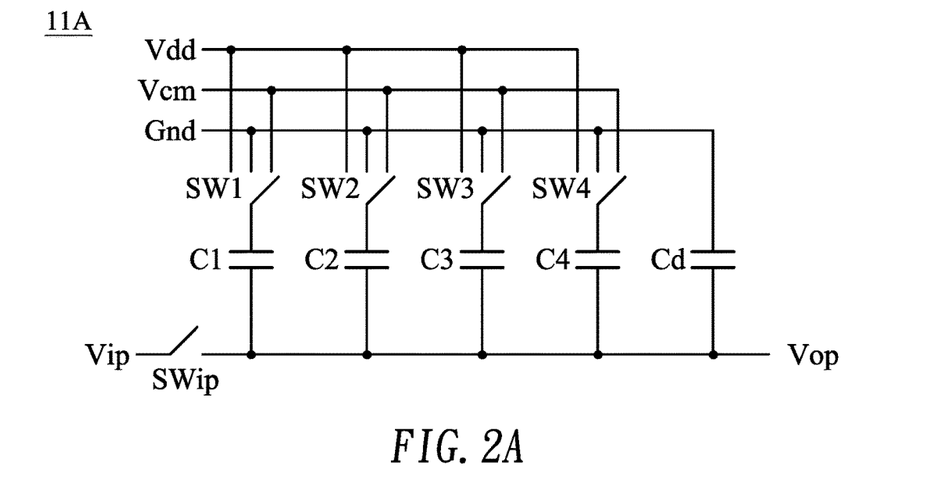
FIG. 2A shows a circuit diagram illustrating the first capacitor DAC of FIG. 1.

FIG. 2A shows a circuit diagram illustrating the first capacitor DAC 11A of FIG. 1. The first capacitor DAC 11A, for an n-bit SAR ADC 100, of the embodiment may include an array composed of n−1 capacitors including a first capacitor, a second capacitor, . . . and an (n−1)-th capacitor. A further capacitor designated as Cd is a parasitic capacitor, which is connected to ground and not switchable. Among the n−1 capacitors, a capacitor with a higher ordinal number has a capacitance less than or equal to a capacitor with a lower ordinal number. Specifically, the n−1 capacitors have capacitances $2^{n-3}C$, $2^{n-4}C$, . . . $2^2C$, $2^1C$, $2^1C$ from ordinal number 1 to n−1 in order, where C is a predetermined value. It is noted that the last two capacitors have a same capacitance. For example, the first capacitor DAC 11A may include 4 capacitors C1 to C4 for a 5-bit SAR ADC 100 as exemplified in FIG. 2A, and the capacitors C1 to C4 may have capacitances 4C, 2C, 1C and 1C respectively. Specifically, first plates (e.g., top plates) of the n−1 capacitors may be coupled to the first input signal Vip via a first input switch SWip. Second plates (e.g., bottom plates) of all the capacitors are individually switchable via corresponding switches (e.g., SW1 to SW4) to a common voltage Vcm, a power supply Vdd or ground Gnd, where Vcm is in a middle of Vdd and Gnd.

Figure 2B:
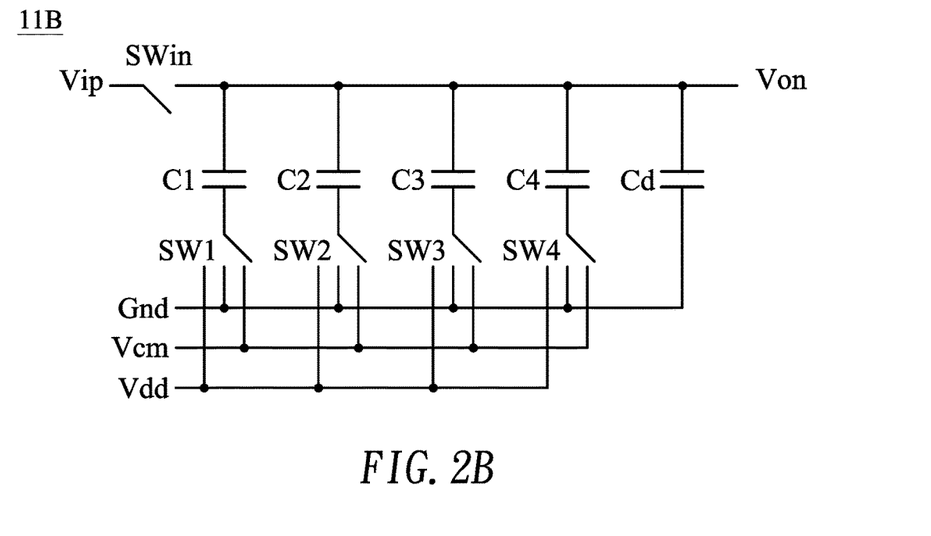
FIG. 2B shows a circuit diagram illustrating the second capacitor DAC of FIG. 1.

Similarly, FIG. 2B shows a circuit diagram illustrating the second capacitor DAC 11B of FIG. 1. The second capacitor DAC 11B, for an n-bit SAR ADC 100, of the embodiment may include an array composed of n−1 capacitors including a first capacitor, a second capacitor, . . . and an (n−1)-th capacitor. A further capacitor designated as Cd is a parasitic capacitor, which is connected to ground and not switchable. Among the n−1 capacitors, a capacitor with a higher ordinal number has a capacitance less than or equal to a capacitor with a lower ordinal number. Specifically, the n−1 capacitors have capacitances $2^{n-3}C$, $2^{n-4}C$, . . . $2^2C$, $2^1C$, $2^1C$ from ordinal number 1 to n−1 in order, where C is a predetermined value. It is noted that the last two capacitors have a same capacitance. For example, the second capacitor DAC 11B may include 4 capacitors C1 to C4 for a 5-bit SAR ADC 100 as exemplified in FIG. 2B, and the capacitors C1 to C4 may have capacitances 4C, 2C, 1C and 1C respectively. Specifically, first plates (e.g., top plates) of the capacitors may be coupled to the second input signal Vin via a second input switch SWin. Second plates (e.g., bottom plates) of all the capacitors are individually switchable via corresponding switches (e.g., SW1 to SW4) to the common voltage Vcm, the power supply Vdd or the ground Gnd, where Vcm is in a middle of Vdd and Gnd.

Referring back to FIG. 1, the SAR ADC 100 of the embodiment may include a comparator 12 (e.g., an operational amplifier) coupled to receive the first output signal Vop and the second output signal Von at a first input node (e.g., a positive (+) input node) and a second input node (e.g., a negative (−) input node) of the comparator 12, respectively. The SAR ADC 100 of the embodiment may include a SAR controller 13 configured to generate a converted output Vout according to a comparison output of the comparator 12. The SAR controller 13 may further control the switches (e.g., SW1 to SW4) of the first capacitor DAC 11A and the switches (e.g., SW1 to SW4) of the second capacitor DAC 11B according to the comparison output of the comparator 12.

Figure 3:
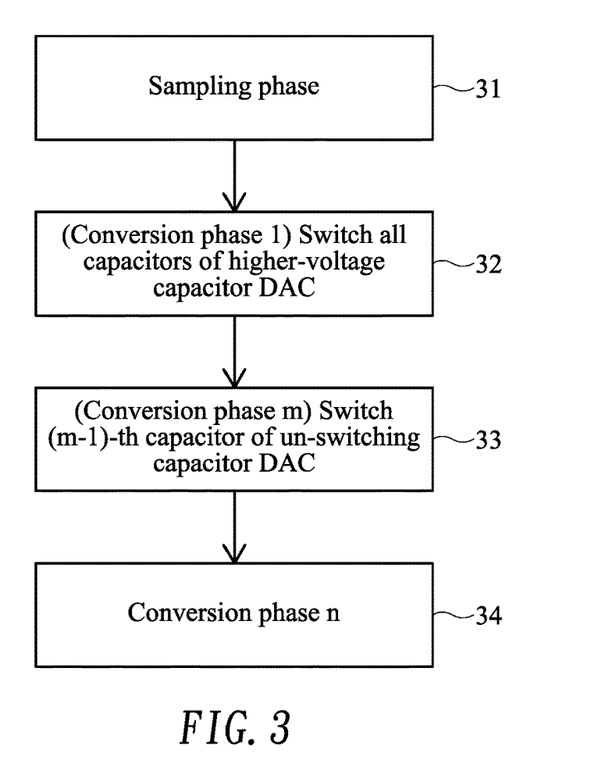
FIG. 3 shows a flow diagram illustrating a method of performing the SAR ADC of FIG. 1 according to one embodiment of the present invention.

FIG. 3 shows a flow diagram illustrating a method of performing the SAR ADC 100 of FIG. 1 according to one embodiment of the present invention. FIG. 4A to FIG. 9B show exemplary switching of the first capacitor DAC 11A and the second capacitor DAC 11B at different phases of performing the SAR ADC 100. In the example shown in FIG. 4A to FIG. 9B for a 5-bit SAR ADC 100, the capacitors C1 to C4 of the first capacitor DAC 11A may have capacitances 4C, 2C, 1C and 1C respectively, and the capacitors C1 to C4 of the second capacitor DAC 11B may have capacitances 4C, 2C, 1C and 1C respectively.

Figures 4A, 4B:
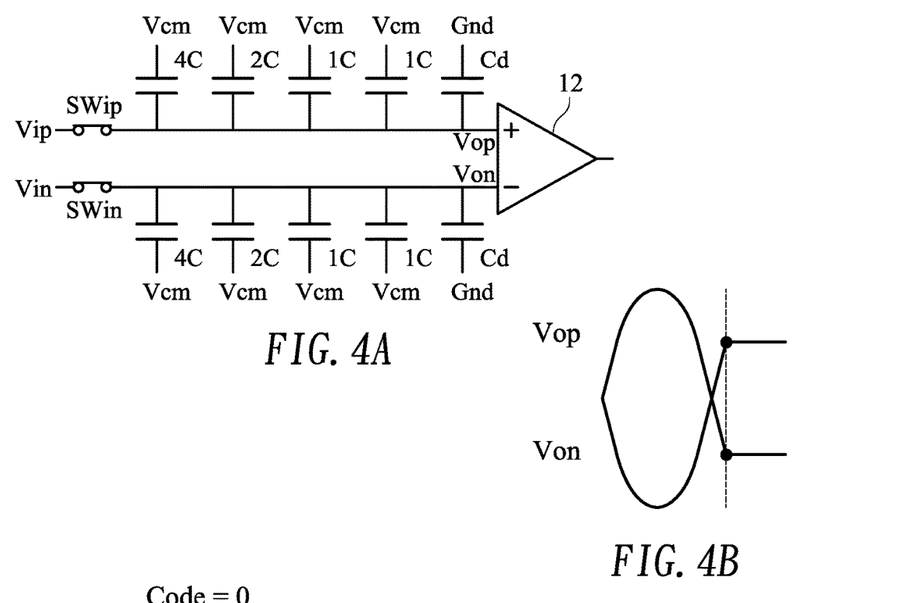

In step 31, that is, sampling phase as shown in FIG. 4A, the second plates of all the capacitors of the first capacitor DAC 11A are switched to the common voltage Vcm via the corresponding switches, and the second plates of all the capacitors of the second capacitor DAC 11B are switched to the common voltage Vcm via the corresponding switches. The first plates of the capacitors of the first capacitor DAC 11A may be switched to the first input signal Vip by closing the first input switch SWip, and the first plates of the capacitors of the second capacitor DAC 11B may be switched to the second input signal Vin by closing the second input switch SWin. The waveforms of the first output signal Vop and the second output signal Von are exemplified in FIG. 4B. After the sampling phase (step 31) is complete, n conversion phases for an n-bit SAR ADC 100 will be executed in sequence for generating n bits of the converted output Vout, respectively.

Figures 5A, 5B:
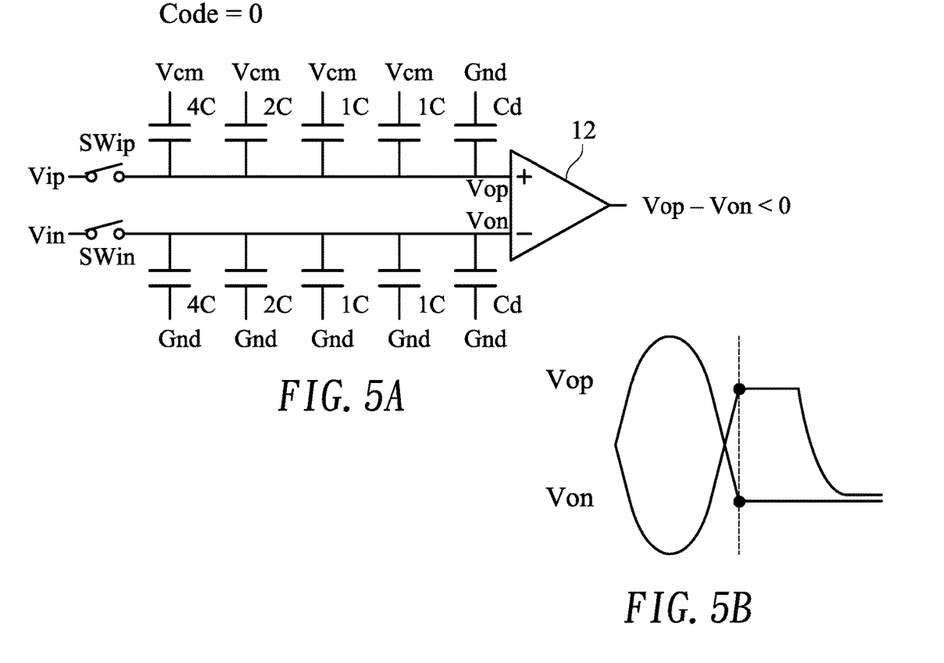

In step 32 (conversion phase 1), as shown in FIG. 5A, the first input switch SWip and the second input switch SWin are opened. A bit at a first most-significant-bit (MSB) position (i.e., leftmost bit) of the converted output Vout is determined according to the comparison output of the comparator 12. For example, if the first output signal Vop is greater than the second output signal Von, the bit at the first MSB position is determined as "1"; otherwise it is determined as "0".

Next, a higher-voltage capacitor DAC between the first capacitor DAC 11A and the second capacitor DAC 11B is determined according to the comparison output of the comparator 12. For example, if the first output signal Vop is greater than the second output signal Von, the first capacitor DAC 11A is determined as the higher-voltage capacitor DAC; otherwise the second capacitor DAC 11B is determined as the higher-voltage capacitor DAC. The second plates of all the capacitors of the higher-voltage capacitor DAC (the second capacitor DAC 11B in this case) are switched to the ground Gnd (from the common voltage Vcm) via the corresponding switches, as shown in FIG. 5A. The waveforms of the first output signal Vop and the second output signal Von are exemplified in FIG. 5B. It is noted that the capacitor DAC other than the higher-voltage capacitor DAC is defined as an un-switching capacitor DAC (the first capacitor DAC 11A in this example).

In an alternative embodiment, in step 32, the second plates of all the capacitors of the lower-voltage capacitor DAC (the first capacitor DAC 11A in this case) are switched to the power supply Vdd (from the common voltage Vcm) via the corresponding switches.

Figures 6A, 6B:
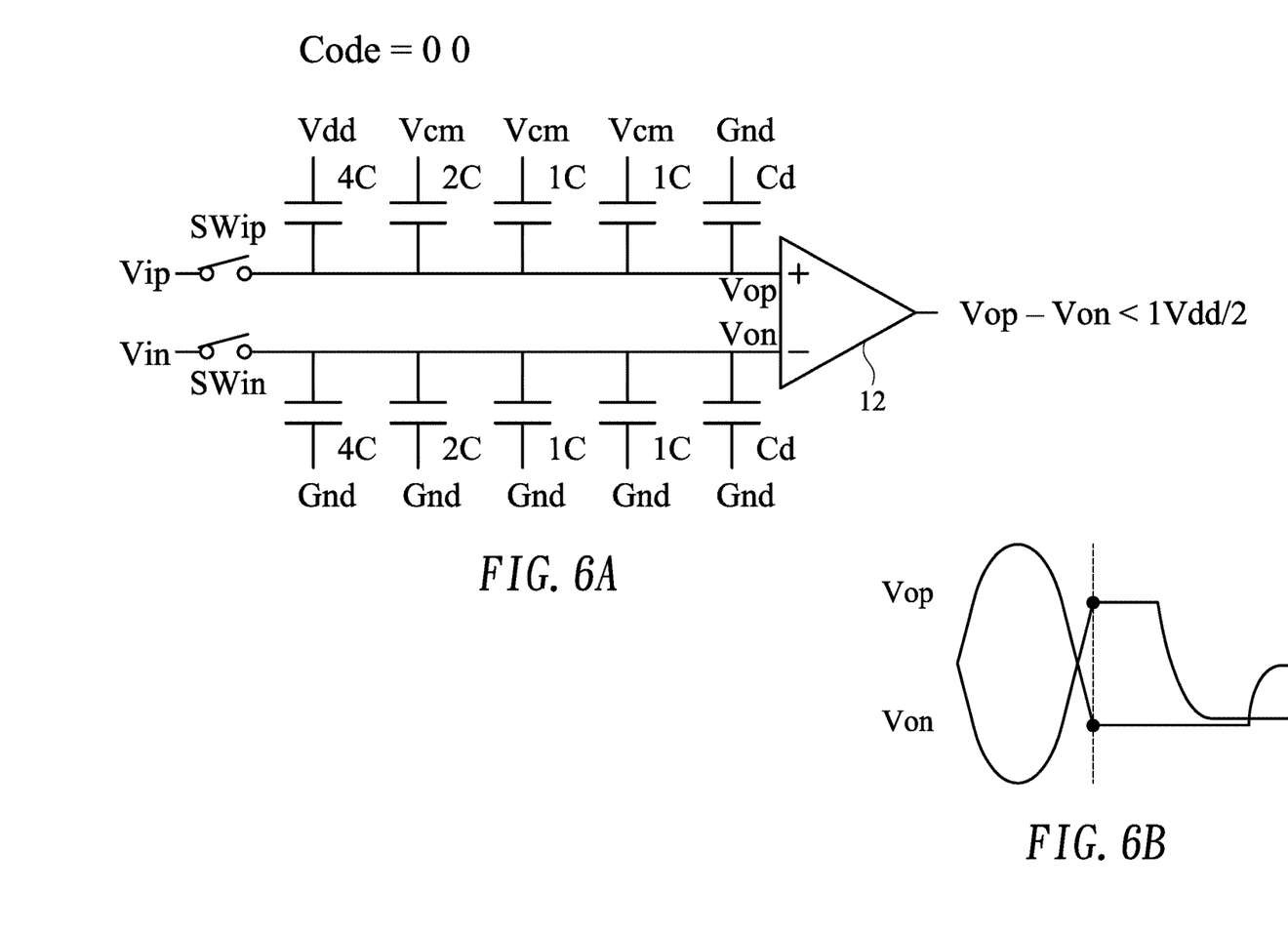

In conversion phase 2, as shown in FIG. 6A, a bit at a second MSB position (i.e., leftmost but one bit) of the converted output Vout is determined according to the comparison output of the comparator 12. For example, if the first output signal Vop is greater than the second output signal Von, the bit at the second MSB position is determined as "1"; otherwise it is determined as "0". Next, the second plate of the first capacitor of the un-switching capacitor DAC (the first capacitor DAC 11A in this case) is switched via the corresponding switch according to the comparison output of the comparator 12. Specifically, it is switched to the ground Gnd if an output signal of the un-switching capacitor DAC is greater than an output signal of the higher-voltage capacitor DAC; otherwise it is switched to the power supply Vdd, as shown in FIG. 6A. The waveforms of the first output signal Vop and the second output signal Von are exemplified in FIG. 6B.

Figures 7A, 7B:
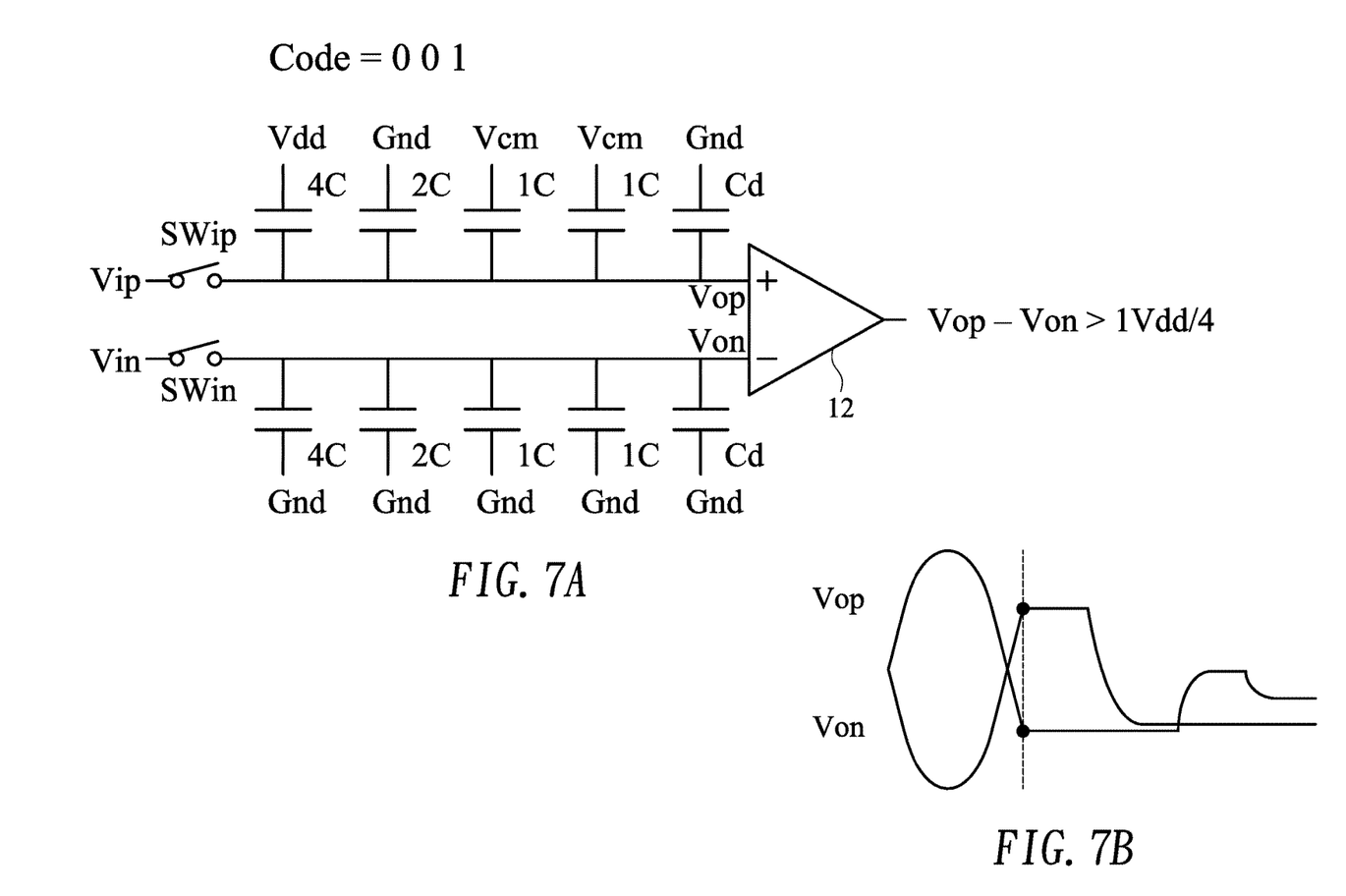

Similarly, in conversion phase 3, as shown in FIG. 7A, a bit at a third MSB position (i.e., leftmost but two bits) of the converted output Vout is determined according to the comparison output of the comparator 12. For example, if the first output signal Vop is greater than the second output signal Von, the bit at the third MSB position is determined as "1"; otherwise it is determined as "0". Next, the second plate of the second capacitor of the un-switching capacitor DAC (the first capacitor DAC 11A in this case) is switched via the corresponding switch according to the comparison output of the comparator 12. Specifically, it is switched to the ground Gnd, as shown in FIG. 7A, if an output signal of the un-switching capacitor DAC is greater than an output signal of the higher-voltage capacitor DAC; otherwise it is switched to the power supply Vdd. The waveforms of the first output signal Vop and the second output signal Von are exemplified in FIG. 7B.

Figures 8A, 8B:
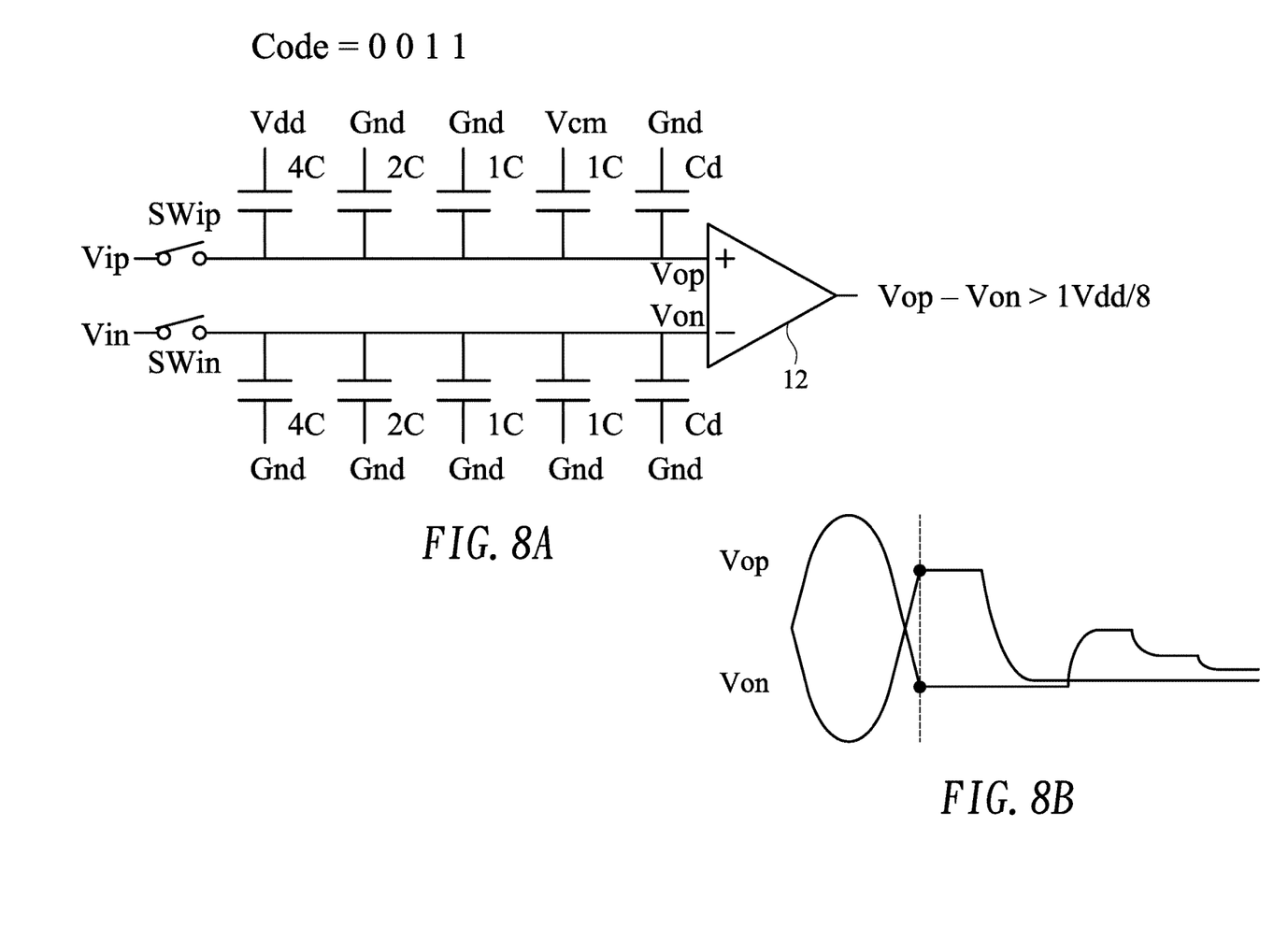

Similarly, in conversion phase 4, as shown in FIG. 8A, a bit at a fourth MSB position (i.e., leftmost but three bits) of the converted output Vout is determined according to the comparison output of the comparator 12. For example, if the first output signal Vop is greater than the second output signal Von, the bit at the fourth MSB position is determined as "1"; otherwise it is determined as "0". Next, the second plate of the third capacitor of the un-switching capacitor DAC (the first capacitor DAC 11A in this case) is switched via the corresponding switch according to the comparison output of the comparator 12. Specifically, it is switched to the ground Gnd, as shown in FIG. 8A, if an output signal of the un-switching capacitor DAC is greater than an output signal of the higher-voltage capacitor DAC; otherwise it is switched to the power supply Vdd. The waveforms of the first output signal Vop and the second output signal Von are exemplified in FIG. 8B.

Generally speaking, in conversion phase m (1<m<n), a bit at an m-th MSB position of the converted output Vout is determined according to the comparison output of the comparator 12. For example, if the first output signal Vop is greater than the second output signal Von, the bit at the m-th MSB position is determined as "1"; otherwise it is determined as "0". Next, the second plate of the (m−1)-th capacitor of the un-switching capacitor DAC is switched via the corresponding switch according to the comparison output of the comparator 12. Specifically, it is switched to the ground Gnd if an output signal of the un-switching capacitor DAC is greater than an output signal of the higher-voltage capacitor DAC; otherwise it is switched to the power supply Vdd.

Figures 9A, 9B:
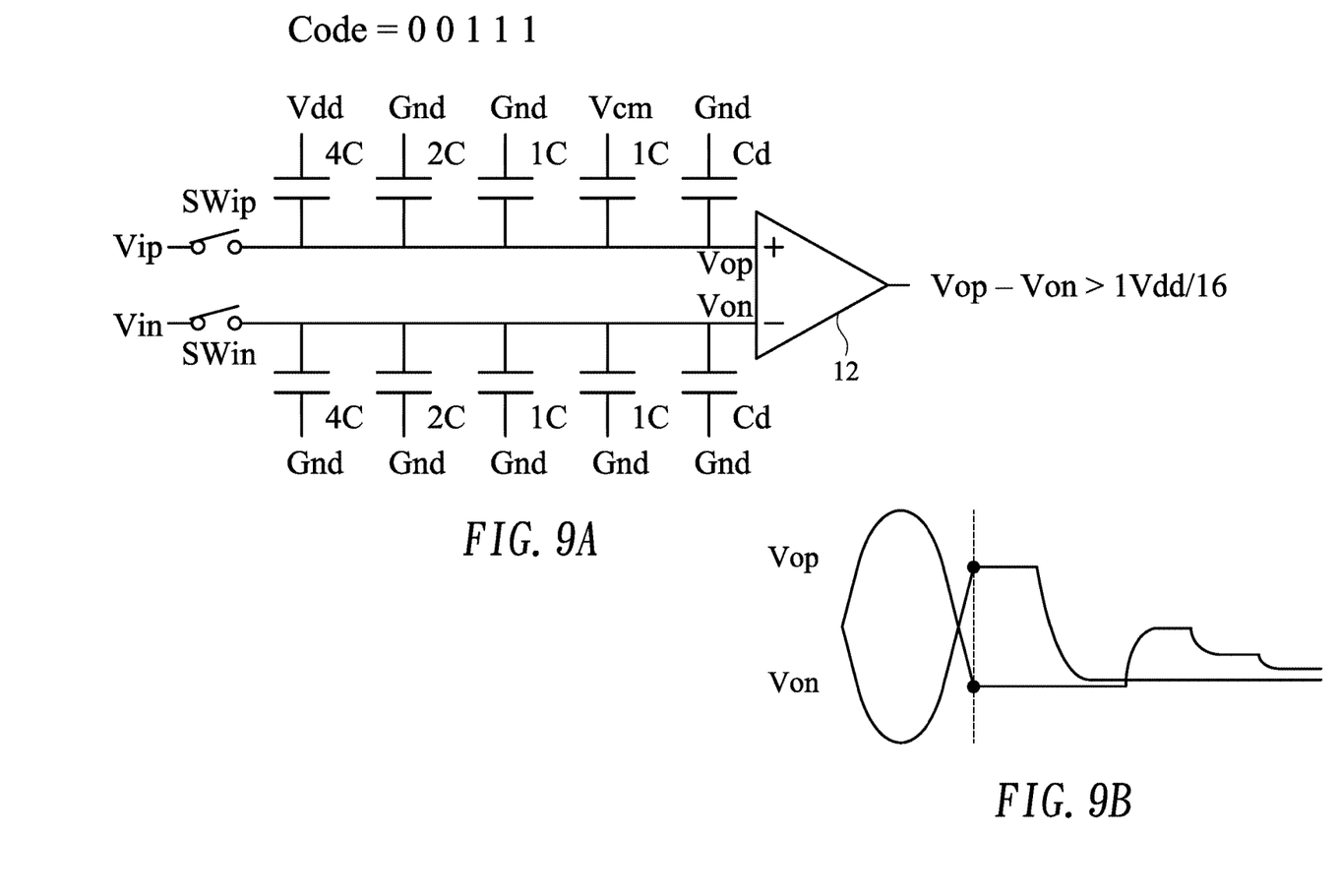

In step 34 (conversion phase 5, conversion phase n or final conversion phase), as shown in FIG. 9A, a bit at a least significant bit (LSB) position (i.e., rightmost bit) of the converted output Vout is determined according to the comparison output of the comparator 12. For example, if the first output signal Vop is greater than the second output signal Von, the bit at the LSB position is determined as "1"; otherwise it is determined as "0". Switching of the capacitor as in the preceding steps is not required in this step. The waveforms of the first output signal Vop and the second output signal Von are exemplified in FIG. 9B.

The embodiment set forth above may be applied with other algorithm such as detect-and-skip (DAS) algorithm. In one example, front bits of n bits to be converted are carried out by using the embodiment set forth above. Accordingly, error due to, for example, inaccuracy of the capacitor DAC, may be obtained, and may be stored as a lookup table or implemented as a logic circuit. According to the obtained error, DAS algorithm may then be carry out to convert rear bits of the n bits to be converted.

Details of DAS algorithm may be referred to "A 0.85 fJ/conversion-step 10b 200 kS/s subranging SAR ADC in 40 nm CMOS," entitled to Hung-Yen Tai et al., in IEEE International Solid-State Circuits Conference, 2014, the disclosure of which is incorporated herein by reference.

Although specific embodiments have been illustrated and described, it will be appreciated by those skilled in the art that various modifications may be made without departing from the scope of the present invention, which is intended to be limited solely by the appended claims.

What is claimed is:

1. A successive approximation register (SAR) analog-to-digital converter (ADC) with high linearity for generating an n-bit converted output, comprising:
   a first capacitor digital-to-analog (DAC); and
   a second capacitor DAC;
   wherein in sampling phase, switching all capacitors of the first capacitor DAC and the second capacitor DAC to a common voltage;
   in a first conversion phase, determining a first most-significant-bit (MSB) of the converted output according to a comparison between output signals of the first capacitor DAC and the second capacitor DAC;
   defining one of the first capacitor DAC and the second capacitor DAC that has greater output signal as a higher-voltage capacitor DAC, and the other of the first capacitor DAC and the second capacitor DAC as an un-switching capacitor DAC;
   switching all capacitors of the higher-voltage capacitor DAC to ground, the common voltage being greater than the ground but less than a power supply;
   in an m-th conversion phase (1<m<n), determining an m-th MSB of the converted output according to a comparison between output signals of the first capacitor DAC and the second capacitor DAC;
   switching an (m−1)-th capacitor of the un-switching capacitor DAC according to a comparison between output signals of the higher-voltage capacitor DAC and the un-switching capacitor DAC; and
   in an n-th conversion phase, determining a least significant bit (LSB) of the converted output according to a comparison between output signals of the first capacitor DAC and the second capacitor DAC.

2. The SAR ADC of claim 1, wherein the first capacitor DAC comprises n−1 capacitors, which have capacitances $2^{n-3}C, 2^{n-4}C, \ldots 2^2C, 2^1C, 2^1C$ from ordinal number 1 to n−1 in order, where C is a predetermined value.

3. The SAR ADC of claim 1, wherein the second capacitor DAC comprises n−1 capacitors, which have capacitances $2^{n-3}C, 2^{n-4}C, \ldots 2^2C, 2^1C, 2^1C$ from ordinal number 1 to n−1 in order, where C is a predetermined value.

4. The SAR ADC of claim 1, wherein the first MSB of the converted output is determined as "1" if the output signal of the first capacitor DAC is greater than the output signal of the second capacitor DAC, and is determined as "0" otherwise.

5. The SAR ADC of claim 1, wherein the m-th MSB of the converted output is determined as "1" if the output signal of the first capacitor DAC is greater than the output signal of the second capacitor DAC, and it determined as "0" otherwise.

6. The SAR ADC of claim 1, wherein the (m−1)-th capacitor of the un-switching capacitor DAC is switched to the ground if the output signal of the un-switching capacitor DAC is greater than the output signal of the higher-voltage capacitor DAC, and is switched to the power supply otherwise.

7. The SAR ADC of claim 1, wherein the LSB of the converted output is determined as "1" if the output signal of the first capacitor DAC is greater than the output signal of the second capacitor DAC, and is determined as "0" otherwise.

8. The SAR ADC of claim 1, further comprising:
   performing a detect-and-skip (DAS) algorithm according to results of generating the n-bit converted output.

9. The SAR ADC of claim 1, wherein a positive input signal is sampled by the first capacitor DAC and a negative input signal is sampled by the second capacitor DAC in the sampling phase.

10. The SAR ADC of claim 1, further comprising a comparator coupled to receive the output signal of the first capacitor DAC and the output signal of the second capacitor DAC.

11. A successive approximation register (SAR) analog-to-digital converter (ADC) with high linearity for generating an n-bit converted output, comprising:
   a first capacitor digital-to-analog (DAC); and
   a second capacitor DAC;
   wherein in sampling phase, switching all capacitors of the first capacitor DAC and the second capacitor DAC to a common voltage;
   in a first conversion phase, determining a first most-significant-bit (MSB) of the converted output according to a comparison between output signals of the first capacitor DAC and the second capacitor DAC;
   defining one of the first capacitor DAC and the second capacitor DAC that has less output signal as a lower-voltage capacitor DAC, and the other of the first capacitor DAC and the second capacitor DAC as an un-switching capacitor DAC;

switching all capacitors of the lower-voltage capacitor DAC to a power supply, the common voltage being greater than ground but less than the power supply;

in an m-th conversion phase (1<m<n), determining an m-th MSB of the converted output according to a comparison between output signals of the first capacitor DAC and the second capacitor DAC;

switching an (m−1)-th capacitor of the un-switching capacitor DAC according to a comparison between output signals of the lower-voltage capacitor DAC and the un-switching capacitor DAC; and in an n-th conversion phase, determining a least significant bit (LSB) of the converted output according to a comparison between output signals of the first capacitor DAC and the second capacitor DAC.

12. The SAR ADC of claim 11, wherein the first capacitor DAC comprises n−1 capacitors, which have capacitances $2^{n-3}C, 2^{n-4}C, \ldots 2^2C, 2^1C, 2^1C$ from ordinal number 1 to n−1 in order, where C is a predetermined value.

13. The SAR ADC of claim 11, wherein the second capacitor DAC comprises n−1 capacitors, which have capacitances $2^{n-3}C, 2^{n-4}C, \ldots 2^2C, 2^1C, 2^1C$ from ordinal number 1 to n−1 in order, where C is a predetermined value.

14. The SAR ADC of claim 11, wherein the first MSB of the converted output is determined as "1" if the output signal of the first capacitor DAC is greater than the output signal of the second capacitor DAC, and is determined as "0" otherwise.

15. The SAR ADC of claim 11, wherein the m-th MSB of the converted output is determined as "1" if the output signal of the first capacitor DAC is greater than the output signal of the second capacitor DAC, and it determined as "0" otherwise.

16. The SAR ADC of claim 11, wherein the (m−1)-th capacitor of the un-switching capacitor DAC is switched to the ground if the output signal of the un-switching capacitor DAC is greater than the output signal of the lower-voltage capacitor DAC, and is switched to the power supply otherwise.

17. The SAR ADC of claim 11, wherein the LSB of the converted output is determined as "1" if the output signal of the first capacitor DAC is greater than the output signal of the second capacitor DAC, and is determined as "0" otherwise.

18. The SAR ADC of claim 11, further comprising:
performing a detect-and-skip (DAS) algorithm according to results of generating the n-bit converted output.

19. The SAR ADC of claim 11, wherein a positive input signal is sampled by the first capacitor DAC and a negative input signal is sampled by the second capacitor DAC in the sampling phase.

20. The SAR ADC of claim 11, further comprising a comparator coupled to receive the output signal of the first capacitor DAC and the output signal of the second capacitor DAC.

* * * * *